(12) United States Patent
Kurauchi et al.

(10) Patent No.: US 9,293,994 B2
(45) Date of Patent: Mar. 22, 2016

(54) ELECTRIC POWER SOURCE DEVICE EQUIPPED WITH TRANSFORMER

(71) Applicant: DENSO CORPORATION, Kariya (JP)

(72) Inventors: Shuji Kurauchi, Nagoya (JP); Katsutoyo Misawa, Kariya (JP); Yuuki Takemoto, Kariya (JP); Yuuichi Handa, Anjo (JP); Shotaro Yamasaki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/338,783

(22) Filed: Jul. 23, 2014

(65) Prior Publication Data

US 2015/0029757 A1    Jan. 29, 2015

(30) Foreign Application Priority Data

Jul. 24, 2013   (JP) .................................. 2013-153668

(51) Int. Cl.
| | |
|---|---|
| *H02M 3/335* | (2006.01) |
| *H05K 7/02* | (2006.01) |
| *H05K 7/14* | (2006.01) |
| *H02M 3/00* | (2006.01) |

(52) U.S. Cl.
CPC ............... *H02M 3/335* (2013.01); *H02M 3/00* (2013.01); *H05K 7/1432* (2013.01)

(58) Field of Classification Search
CPC ................................ H02M 3/335; H05K 7/02
See application file for complete search history.

(56) References Cited

U.S. PATENT DOCUMENTS

| | | | |
|---|---|---|---|
| 2013/0100634 A1 | 4/2013 | Okubo et al. | |
| 2014/0306791 A1* | 10/2014 | Kanazawa | H01F 27/06 336/199 |

FOREIGN PATENT DOCUMENTS

| | | |
|---|---|---|
| JP | 2000-14149 | 1/2000 |
| JP | 2000-278936 | 10/2000 |
| JP | 2001-196229 | 7/2001 |
| JP | 2002-261417 | 9/2002 |
| JP | 2008-042074 | 2/2008 |
| JP | 2011-182499 | 9/2011 |
| JP | 2013-34270 | 2/2013 |
| JP | 2013-90533 | 5/2013 |

OTHER PUBLICATIONS

Office Action (2 pages) dated Jun. 9, 2015, issued in corresponding Japanese Application No. 2013-153668 and English translation (2 pages).

* cited by examiner

*Primary Examiner* — Emily P Pham
(74) *Attorney, Agent, or Firm* — Nixon & Vanderhye P.C.

(57) ABSTRACT

An electric power source device has a transformer, primary side semiconductor components, secondary side semiconductor components, a choke coil, a base plate and first circuit substrate and one or more second circuit substrates. The transformer has a primary side coil and a secondary side coil. The primary side semiconductor components form a primary side circuit connected to the primary side coil. The secondary side semiconductor components form a secondary side circuit connected to the secondary side coil. The choke coil has a smoothing circuit for smoothing an output voltage. The transformer, the primary side semiconductor components, the secondary side semiconductor components and the choke coil are formed on the base plate. The first circuit substrate is arranged parallel to the base plate. The second circuit substrate is arranged parallel to a normal line of the first circuit substrate.

19 Claims, 8 Drawing Sheets

ELECTRIC POWER SOURCE DEVICE EQUIPPED WITH TRANSFORMER

CROSS-REFERENCE TO RELATED APPLICATION

This application is related to and claims priority from Japanese Patent Application No. 2013-153668 filed on Jul. 24, 2013, the contents of which are hereby incorporated by reference.

BACKGROUND OF THE INVENTION

1. Field of the Invention

The present invention relates to electric power source devices equipped with a transformer.

2. Description of the Related Art

An electric power source device such as a direct current to direct current (DC-DC) converter has a transformer, a choke coil, various types of electronic components etc. Further, the electric power source device is equipped with a circuit substrate which forms a control circuit and some of a main circuit. For example, a patent document 1, Japanese patent laid open publication No. 2013-34270, discloses an electric power source device having a structure in which a circuit substrate having a large area is arranged in the inside of a housing.

A recent technique provides an electric power source device having a miniaturized structure accompanied with downsizing of each of a transformer, a choke coil and other electronic components. However, it is difficult to perform downsizing of the circuit substrate when compared with the downsizing of other components because the circuit substrate has a wide area which expands in 2 dimensions. The recent trend of downsizing of the electric power source device causes a difficulty of correctly arranging the circuit substrate in a miniaturized size. In other words, it becomes difficult to reduce an overall size of the electric power source device because of having the circuit substrate.

SUMMARY

It is therefore desired to provide an electric power source device having an improved structure capable of easily reducing an overall size of the electric power source device.

An exemplary embodiment provides an electric power source device. The electric power source device has a transformer, primary side semiconductor components, secondary side semiconductor components, a choke coil, a plurality of circuit substrates, and a base plate, for example. The transformer has a primary coil and a secondary coil. The primary side semiconductor components form a primary side circuit which is connected to the primary coil of the transformer. The secondary side semiconductor components form a secondary side circuit which is connected to the secondary coil of the transformer. The choke coil forms a smoothing circuit capable of smoothing an output voltage. A control circuit is formed on the circuit substrates. The control circuit controls some components in the primary side circuit and some components in the secondary side circuit, or at least one selected from the primary side circuit and the secondary side circuit. The transformer, the primary side semiconductor components, the secondary side semiconductor components and the choke coil are formed on the base plate. In the electric power source device, the plurality of the circuit substrates comprises a first circuit substrate and one or more second circuit substrates. The first circuit substrate is arranged parallel to the base plate. The second circuit substrate is arranged parallel to a normal line of the first circuit substrate.

In the structure of the electric power source device previously described, the first circuit substrate and the second circuit substrate are arranged so that the first circuit substrate is arranged parallel to the base plate, and the second circuit substrate is arranged parallel to the direction of a normal line of the first circuit substrate. This improved structure makes it possible to suppress the overall area of the circuit substrates from expanding in a specified direction.

That is, the overall area of the circuit substrates becomes increased in the direction of a normal line thereof when a plurality of the circuit substrates is arranged parallel to the longitudinal direction, i.e. the major direction thereof. The overall area of the circuit substrate becomes increased when necessary circuit components are arranged on a single circuit substrate.

On the other hand, the electric power source device according to the present invention has the improved structure as previously described. In particular, the second circuit substrate is arranged parallel to the direction of a normal line of the first circuit substrate. In other words, the normal line of the first circuit substrate is arranged in a direction which is perpendicular to the normal line of the second circuit substrate. This improved structure of the electric power source device makes it possible to prevent the overall area of the plurality of the circuit substrates from being expanded in a specified direction. As a result, this improved structure makes it possible to suppress the overall size of the electric power source device from increasing in a specified direction, and provide the electric power source device having a miniaturized structure.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
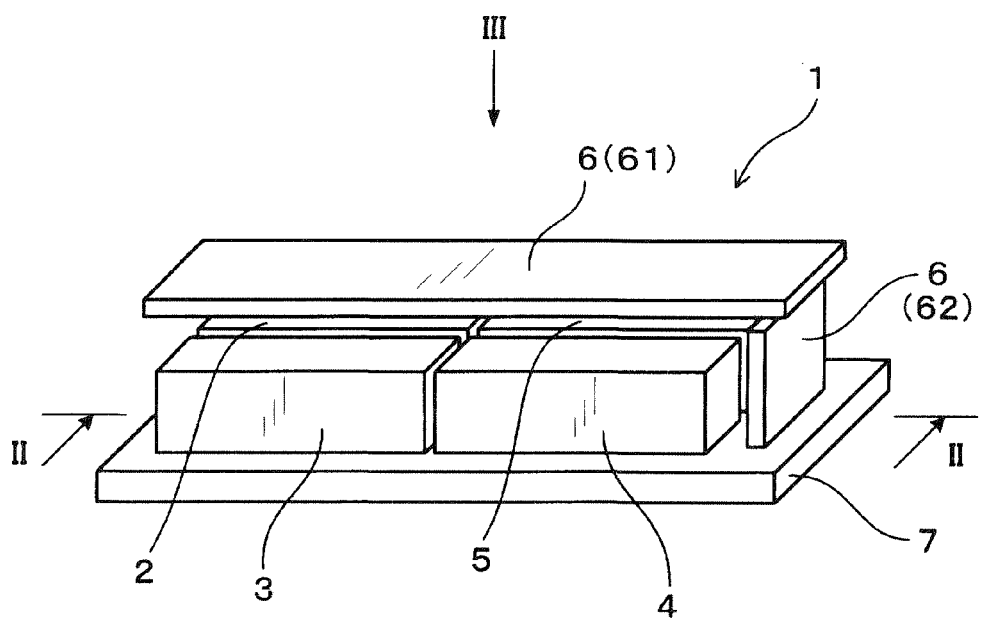
FIG. 1 is a perspective view showing an overall structure of an electric power source device according to a first exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

In an electric power source device according to the present invention, a second circuit substrate is arranged in substantially parallel to a normal line of a first circuit substrate. In other words, it is acceptable to arrange the second circuit substrate in substantially parallel to the normal line of the first circuit substrate within a specified incline. Further, the circuit substrate has at least a control circuit capable of controlling at least one of some components in a primary side circuit and some components in a secondary side circuit or at least one of the primary side circuit and the secondary side circuit. That is, it is acceptable for the electric power source device to have a structure in which at least one of the primary side circuit, the secondary side circuit and the control circuit are formed on each of the circuit substrates. Further at least one of primary side semiconductor components, secondary side semiconductor components, the choke coil, a transformer and electronic components forming the electric power source device are directly or indirectly formed on each of the circuit substrates. There is a capacitor in a filter, which is used as electronic components forming the electric power source device. It is acceptable that the transformer, the primary side semiconductor components, the secondary side semiconductor components and the choke coil are directly or indirectly connected to a base plate.

Still further, it is preferable for the electric power source device to have a structure in which the circuit substrate is arranged facing at least one of the transformer, the primary side semiconductor components, the secondary side semiconductor components and the choke coil. This structure makes it possible to miniaturize the overall size of the electric power source device in a longitudinal direction or a major direction of the first circuit substrate and a longitudinal direction or a major direction of the second circuit substrate.

It is preferable for the electric power source device to have a structure in which at least two components selected from the transformer, the primary side semiconductor components, the secondary side semiconductor components and the choke coil are stacked in the direction of a normal line of the base plate to form a stacked section. This structure makes it possible to miniaturize the electric power source device, i.e. reduce the overall size of the electric power source device in the longitudinal direction, i.e. the major direction of the base plate. Further, this structure makes it possible to expand the area of the second circuit substrate while suppressing the overall size of the electric power source device from being expanded.

Still further, it is preferable for the electric power source device to have a structure in which the first circuit substrate and the second circuit substrate are arranged to face the stacked section. This structure makes it possible to miniaturize the overall size of the electric power source device with high efficiency.

First Exemplary Embodiment

A description will be given of the electric power source device 1 according to a first exemplary embodiment with reference to FIG. 1 to FIG. 4.

Figure 2:
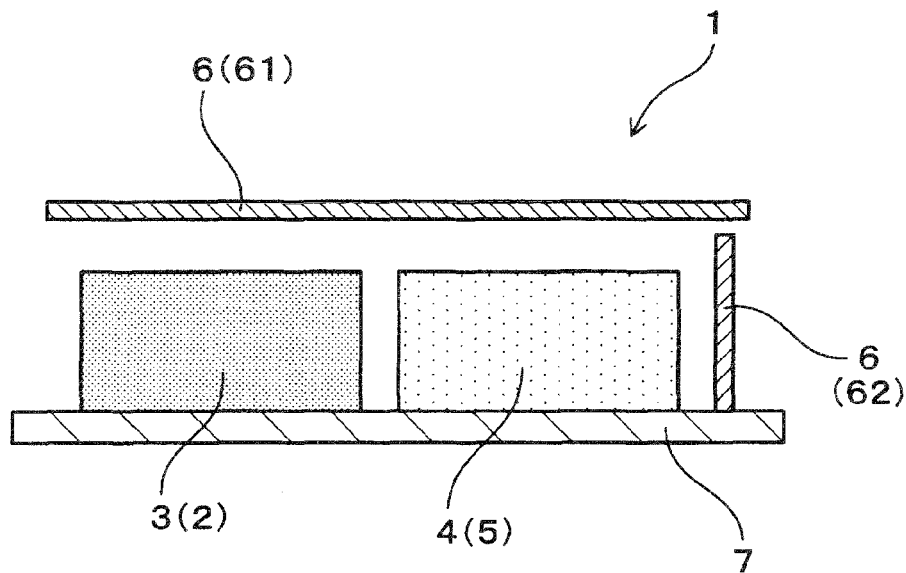
FIG. 2 is a view showing a cross section of the electric power source device along the line II-II shown in FIG. 1.
Figure 3:
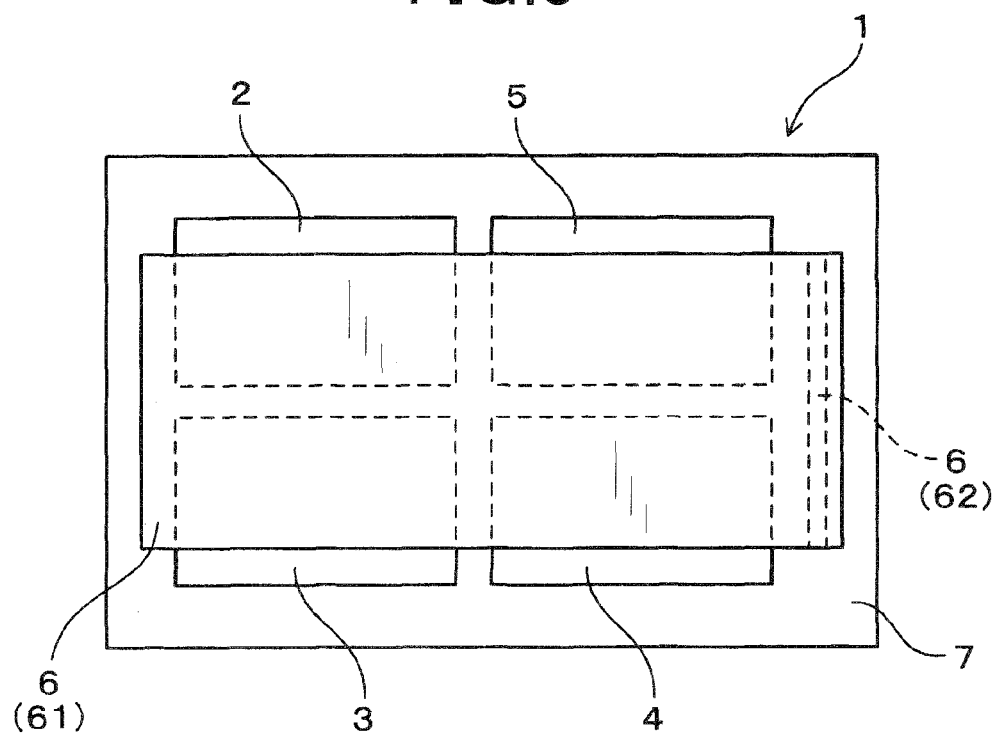
FIG. 3 is a view showing a cross section of the electric power source device along the line shown in FIG. 1.

FIG. 1 is a perspective view showing an overall structure of the electric power source device 1 according to the first exemplary embodiment. FIG. 2 is a view showing a cross section of the electric power source device 1 along the line II-II shown in FIG. 1. FIG. 3 is a view showing a cross section of the electric power source device 1 along the line shown in FIG. 1.

As shown in FIG. 1, FIG. 2 and FIG. 3, the electric power source device 1 according to the first exemplary embodiment has a transformer 2, a primary side semiconductor component 3, a secondary side semiconductor component 4 and a choke coil 5. The transformer 2 is comprised of a primary coil and a secondary coil. The primary side semiconductor component 3 forms a primary side circuit connected to the primary coil of the transformer 2. The secondary side semiconductor component 4 forms a secondary side circuit connected to the secondary coil of the transformer 2. The choke coil 5 forms a smoothing circuit capable of smoothing an output voltage.

Furthermore, the electric power source device 1 according to the first exemplary embodiment has a plurality of circuit substrates 6 and a base plate 7. At least one of some components in the primary side circuit, some components in the secondary side circuit or the primary side circuit and the secondary side circuit are formed on the circuit substrate 6. The transformer 2, the primary side semiconductor component 3, the secondary side semiconductor component 4 and the choke coil 5 are formed on the base plate 7. For example, the circuit substrates 6 are composed of a first circuit substrate 61 and a second circuit substrate 62. The first circuit substrate 61 is arranged parallel to the base plate 7. The second circuit substrate 62 is arranged parallel to a direction of a normal line of the first circuit substrate 61.

The electric power source device 1 according to the first exemplary embodiment is a direct current to a direct current converter (DC-DC converter). For example, the electric power source device 1 is mounted to en electric vehicle and a hybrid vehicle, and decreases a high direct current voltage (DC voltage) to a low DC voltage. The decreased low DC voltage is supplied to a rechargeable battery. The rechargeable battery supplies electric power to auxiliary devices mounted to a motor vehicle such as an electric vehicle and a hybrid vehicle.

The primary side circuit forms a switching circuit. The primary side semiconductor component 3 in the primary side circuit is composed of a semiconductor module equipped with a plurality of switching elements. It is possible to use an insulated gate bipolar transistor (IGBT) or a metal oxide semiconductor field effect transistor (MOS FET) as the switching element. It is acceptable to use a discrete semiconductor component instead of the semiconductor module as the primary side semiconductor component 3.

The secondary side circuit forms a rectifying circuit. The secondary side semiconductor component 4 is comprised of a diode module equipped with a plurality of diodes. It is possible to use a semiconductor module equipped with a plurality of MOS FETs. It is acceptable to use a discrete semiconductor component as the secondary side semiconductor component 4.

The smoothing circuit is comprised of the choke coil 5 and a capacitor (not shown). When a DC power is supplied to the electric power source device 1 according to the first exemplary embodiment, the primary side circuit (which forms the switching circuit) converts the supplied DC power to an alternating current (AC) power. The converted AC power is supplied to the transformer 2. The transformer 2 decreases a voltage of the AC power. The secondary side circuit (which forms the rectifying circuit) rectifies the decreased AC power and generates a DC power. The smoothing circuit smoothes the DC power to generate and output the smoothed DC voltage.

The control circuit (which forms a drive circuit) is formed on the first circuit substrate 61 of the circuit substrate 6. The primary side semiconductor component 3 is also formed on the first circuit substrate 61. That is, a gate terminal of the primary side semiconductor component 3 is connected to the control circuit formed on the first circuit substrate 61. The control circuit generates and outputs control signals to each of the switching elements in the primary side semiconductor component 3. When receiving the control signals transmitted from the control circuit, the switching elements perform a switching operation.

Some components in the smoothing circuit is formed on the second circuit substrate 62 of the circuit substrate 6. The choke coil 5 is connected to the second circuit substrate 62. The capacitor and other components are connected to the second circuit substrate 62. That is, the smoothing circuit is comprised of the choke coil 5, the capacitor and the second circuit substrate 62.

Because the secondary side semiconductor component 4 is comprised of a diode module equipped with a plurality of diodes as previously described, it is not necessary to control the secondary side semiconductor component 4. In other words, it is not necessary to directly connect the secondary side semiconductor component 4 to the circuit substrate 6. However, when the secondary side semiconductor component 4 is comprised of MOS FETs, etc. and the secondary side circuit is used as a synchronous rectifying circuit, it is necessary to add a control circuit (as a drive circuit) to perform the switching control of the MOS FETs. In this case, it is necessary to have a structure in which an additional control circuit capable of performing the rectifying operation is formed on the first circuit substrate 61 or the second circuit substrate 62, and this additional control circuit is also connected to the secondary side semiconductor component 4.

As shown in FIG. 1 and FIG. 2, the first circuit substrate 61 and the second circuit substrate 62 are arranged so that the main surface of each of the first circuit substrate 61 and the second circuit substrate 62 faces the transformer 2, the primary side semiconductor component 3, the secondary side semiconductor component 4 and the choke coil 5. As shown in FIG. 3, the transformer 2, the primary side semiconductor component 3, the secondary side semiconductor component 4 and the choke coil 5 are arranged on the base plate 7 along the longitudinal direction, i.e. the major direction of the base plate 7. The base plate 7 is made of metal such as aluminum, for example.

As shown in FIG. 2, the first circuit substrate 61 is arranged parallel to the base plate 7 so that the transformer 2, the primary side semiconductor component 3, the secondary side semiconductor component 4 and the choke coil 5 are arranged between the first circuit substrate 61 and the base plate 7.

On the other hand, the second circuit substrate 62 is arranged so that a normal line of each of the base plate 7 and the first circuit substrate 61 is perpendicular to a normal line of the second circuit substrate 62. In the structure of the electric power source device according to the first exemplary embodiment, as shown in FIG. 2, the main surface of the second circuit substrate 62 faces the side surface of the secondary side semiconductor component 4 and the choke coil 5.

Figure 4:
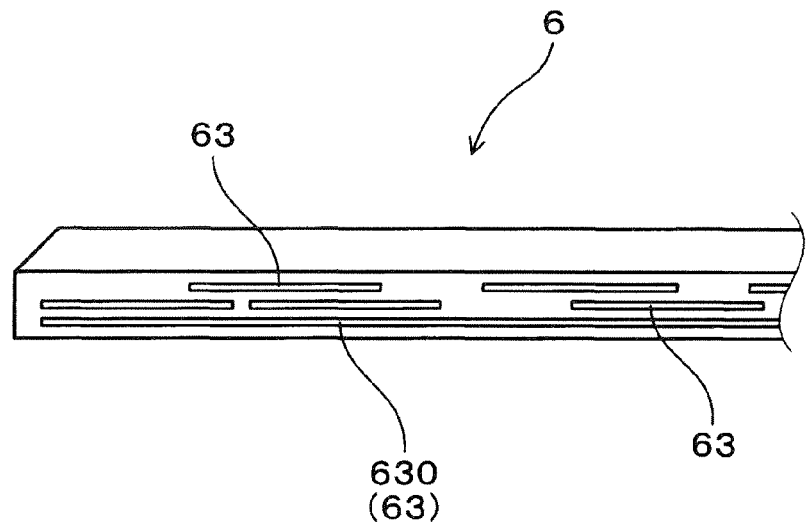
FIG. 4 is a perspective view showing a partial cross section of a circuit substrate in the electric power source device according to the first exemplary embodiment of the present invention.

FIG. 4 is a perspective view showing a partial cross section of the circuit substrate 6 in the electric power source device 1 according to the first exemplary embodiment. As shown in FIG. 4, the circuit substrate 6 has a ground conductive layer 630 which is formed in an expanded direction of the circuit substrate 6. For example, the circuit substrate 6 is comprised of a printed wiring board in which one of conductive layers 63 is used as the ground conductive layer 630.

In particular, it is preferable to form the ground conductive layer 630 on the section of the circuit substrate 63 which corresponds to the section on which the transformer 2 and the choke coil 5. Further, the ground conductive layer 630 is formed on each of the first circuit substrate 61 and the second circuit substrate 62. Still further, it is preferable to form the ground conductive layer 630 close to the transformer 2 or the choke coil 5, not close to the other conductive layer 63 (in particular, the control circuit.)

It is acceptable for the electric power source device 1 according to the first exemplary embodiment to have a structure in which the first circuit substrate 61 is connected to the second circuit substrate 62 or a structure in which the first circuit substrate 61 and the second circuit substrate 62 are arranged independently. In addition, it is acceptable to have a structure in which the circuits formed on the first circuit substrate 61 are electrically connected to the circuits formed on the second circuit substrate 62 or a structure in which the circuits formed on the first circuit substrate 61 are electrically insulated from the circuits formed on the second circuit substrate 62.

A description will now be given of the actions and effects of the electric power source device 1 according to the first exemplary embodiment.

The first circuit substrate 61 and the second circuit substrate 62 in the circuit substrate 6 are arranged in the structure of the electric power source device 1. That is, the first circuit substrate 61 is arranged parallel to the base plate 7 and the second circuit substrate 62 is arranged parallel to a direction of a normal line of the first circuit substrate 61. This structure makes it possible to suppress the overall area of the circuit substrate 6 from expanding in a specified direction (for example, the direction of a normal line of the base plate 7.)

That is, when the circuit substrates are arranged parallel to the longitudinal direction, i.e. the major surface of the circuit substrates, the overall area of the circuit substrates becomes increased. Even if specified circuits are arranged on a single circuit substrate, the overall area thereof becomes increased.

On the other hand, the second circuit substrate 62 is arranged parallel to the direction of a normal line of the first circuit substrate 61 in the structure of the electric power source device 1 according to the first exemplary embodiment. In other words, the electric power source device 1 has a structure in which the direction of a normal line of the first circuit substrate 61 is perpendicular to the direction of a normal line of the second circuit substrate 62. This arrangement makes it possible to prevent the overall area of the circuit substrate 6 from expanding in a specified direction. As a result, it is possible to suppress the overall size of the electric power source device 1 from expanding in a specified direction, and to provide the electric power source device 1 having an easily miniaturized size.

Further, in the structure of the electric power source device 1 according to the first exemplary embodiment, the first circuit substrate 61 and the second circuit substrate 62 are arranged to face the transformer 2, the primary side semiconductor component 3, the secondary side semiconductor component 4 and the choke coil 5. This structure makes it possible to reduce the overall size of the electric power source device 1 in the longitudinal direction of the first circuit substrate 61 and the longitudinal direction of the second circuit substrate 62. That is, the transformer 2, the primary side semiconductor component 3, the secondary side semiconductor component 4 and the choke coil 5 are overlapped with the first circuit substrate 61 in the direction of a normal line of the first circuit substrate 61 and the second circuit substrate 62 in the direction of a normal line of the second circuit substrate 62. This makes it possible to miniaturize the electric power source device 1 and provide the electric power source device 1 having a miniaturized structure in the longitudinal direction of each of the first circuit substrate 61 and the second circuit substrate 62.

Because of having the ground conductive layer 630, the circuit substrate 6 has a feature of shielding electromagnetic noise propagated from the transformer 2 and the choke coil 5, and prevents the electromagnetic noise from leaking to the outside of the electric power source device 1. Still further, when the ground conductive layer 630 is arranged close to the transformer 2 and the choke coil 5 more than other conductive layers 63 (in particular, the control circuit), this structure makes it possible to prevent the control circuit etc. from being influenced by electromagnetic noise.

As previously described, the first exemplary embodiment can provide the electric power source device 1 having a miniaturized size.

Second Exemplary Embodiment

A description will be given of the electric power source device 1 according to the second exemplary embodiment with reference to FIG. 5.

Figure 5:
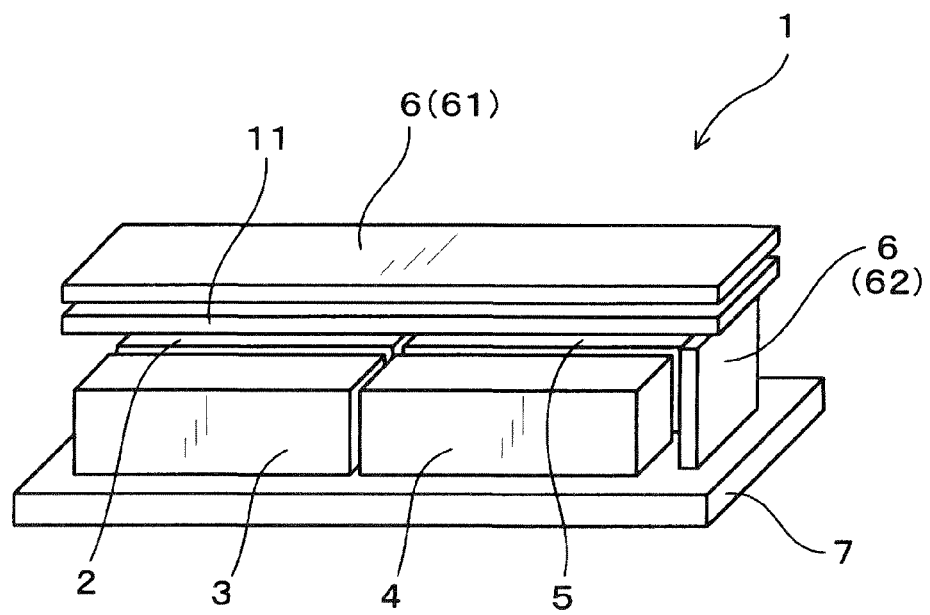
FIG. 5 is a perspective view showing an overall structure of an electric power source device according to a second exemplary embodiment of the present invention.

FIG. 5 is a perspective view showing an overall structure of the electric power source device 1 according to the second exemplary embodiment. The concept of the electric power source device 1 according to the second exemplary embodiment has a structure in which a conductive plate 11 is arranged between at least one of the transformer 2 and the choke coil 5 and at least some components in the circuit substrate 6.

As shown in FIG. 5, the conductive plate 11 is arranged between the first circuit substrate 61 and the transformer 2 and the choke coil 5. Further, the conductive plate 11 is also arranged between the first circuit substrate 11 and the primary side semiconductor component 3 and the secondary side semiconductor component 4. For example, the conductive plate 11 is made of a copper plate. However, it is possible to form the conductive plate 11 by using material other than copper plate.

Still further, it is particularly preferable to arrange the conductive plate 11 to face the control circuit formed on the circuit substrate 6 (as the first circuit substrate 61.)

Other components in the electric power source device 1 according to the second exemplary embodiment are similar to those of the electric power source device 1 according to the first exemplary embodiment. The same components between the second exemplary embodiment and the first exemplary embodiment will be referred to with the same reference numbers.

The structure of the electric power source device 1 according to the second exemplary embodiment shown in FIG. 5 prevents electromagnetic noise generated in the transformer 2 and the choke coil 5 propagating to circuits formed on the circuit substrate 6 (the first circuit substrate 61). In particular, the presence of the conductive plate 11 arranged facing the control circuit, i.e. formed between the transformer 2 or the choke coil 5 makes it possible to prevent the control circuit from being influenced by electromagnetic noise. Other features of the electric power source device 1 according to the second exemplary embodiment are the same of those of the electric power source device according to the first exemplary embodiment.

It is possible to arrange the conductive plate 11 between the second circuit substrate 62 and the choke coil 5 etc. This makes it possible to suppress the control circuit formed on the second circuit substrate 62 from being influenced by electromagnetic noise. Still further, this structure makes it possible to discharge the heat energy generated in the choke coil 5, etc. to the outside of the electric power source device through the conductive layer 11.

Third Exemplary Embodiment

A description will be given of the electric power source device 1 according to the third exemplary embodiment with reference to FIG. 6.

Figure 6:
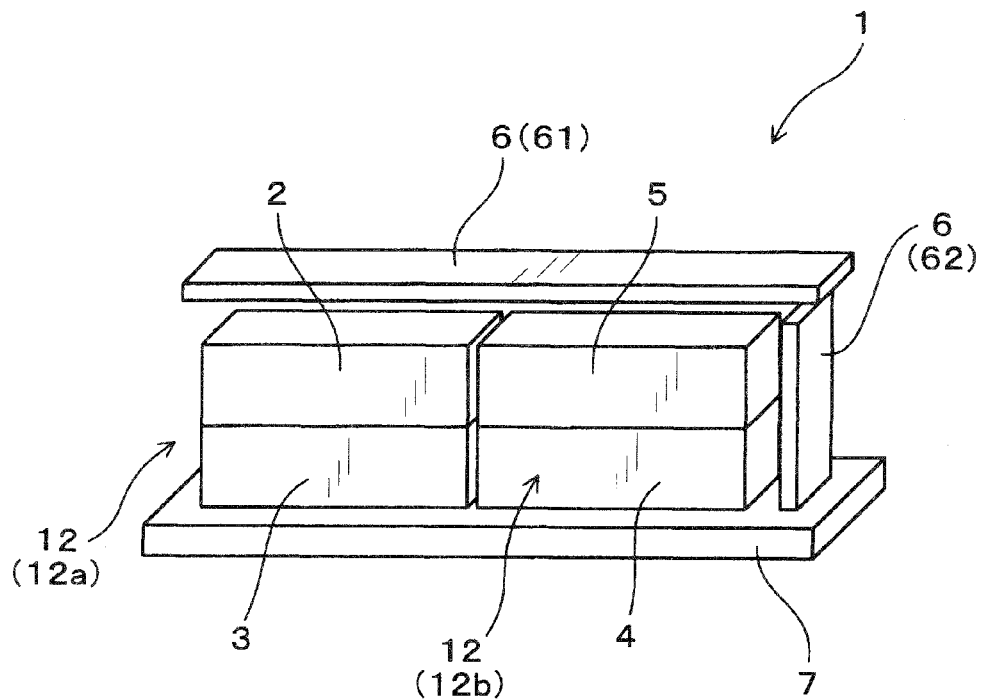
FIG. 6 is a perspective view showing an overall structure of an electric power source device according to a third exemplary embodiment of the present invention.

FIG. 6 is a perspective view showing an overall structure of the electric power source device 1 according to the third exemplary embodiment.

The electric power source device 1 according to the third exemplary embodiment has a structure in which at least two components of the transformer 2, the primary side semiconductor component 3, the secondary side semiconductor component 4 and the choke coil 5 are stacked in the direction of a normal line of the base plate 7 to form a stacked section 12.

In the structure of the electric power source device 1 according to the third exemplary embodiment, the primary side semiconductor component 3 and the transformer 2 are stacked together to form a first stacked section 12a and the secondary side semiconductor component 4 and the choke coil 5 are stacked together to form a second stacked section 12b.

In each of the stacked sections 12 (12a and 12b), the primary side semiconductor component 3 and the secondary side semiconductor component 4 are arranged the base plate 7 side, and the transformer 2 and the choke coil 5 are arranged the first circuit substrate 61 side.

As shown in FIG. 6, the first circuit substrate 61 and the second circuit substrate 62 are arranged to face the stacked sections 12 (12a, 12b). That is, the first stacked section 12a and the second stacked section 12b are arranged along the longitudinal direction of the base plate 7. Further, the second circuit substrate 62 is arranged to face the side surface of the second stacked section 12b. The second circuit substrate 62 is vertically arranged in the stacking direction of the second stacked section 12b, and also in the stacking direction of the first stacked section 12a. As shown in FIG. 6, the second circuit substrate 62 is arranged between the base plate 7 and the first circuit substrate 61 so that a direction along a longitudinal part of the second circuit substrate 62 becomes similar to the stacking direction of the stacked section 12 (12a, 12b).

Other components in the electric power source device 1 according to the third exemplary embodiment are similar to those of the electric power source device 1 according to the first exemplary embodiment. The same components between the third exemplary embodiment and the first exemplary embodiment will be referred to with the same reference numbers.

The third exemplary embodiment provides the electric power source device 1 having a reduced size in the longitudinal direction of the base plate 7. In addition to this feature, it is possible to increase the overall area of the second circuit substrate 62 while suppressing the overall size of the electric power source device 1 from increasing.

Because each of the first circuit substrate 61 and the second circuit substrate 62 is arranged to face the stacked section 12 (12a, 12b), it is possible to provide the electric power source device according to the third exemplary embodiment having a reduced size in the longitudinal direction in area of the first circuit substrate 61 and the second circuit substrate 62.

Other components in the electric power source device 1 according to the third exemplary embodiment are similar to those of the electric power source device 1 according to the first exemplary embodiment. Further, the electric power source device according to the third exemplary embodiment has the same effects of the electric power source device according to the first exemplary embodiment as previously described.

Still further, the concept of the present invention is not limited by the structural arrangement of the transformer 2, the primary side semiconductor component 3, the secondary side semiconductor component 4 and the choke coil 5 in the electric power source device according to the third exemplary embodiment previously described. For example, it is possible for the stacked sections 12 (12a, 12b) to have a structure in which the primary side semiconductor component 3 and the choke coil 5 are stacked, and the secondary side semiconductor component 4 and the transformer 2 are stacked. It is also possible to have a different stacked structure between the transformer 2, the primary side semiconductor component 3, the secondary side semiconductor component 4 and the choke coil 5. Furthermore, the concept of the present invention is not limited by the structure of the electric power source device previously described. It is possible to have a different arrangement of the stacked sections 12 (12a, 12b). For example, it is acceptable to have a structure in which the second circuit substrate 62 is arranged close to and face both the stacked sections 12 (12a, 12b).

Fourth Exemplary Embodiment

A description will be given of the electric power source device 1 according to the fourth exemplary embodiment with reference to FIG. 7.

Figure 7:
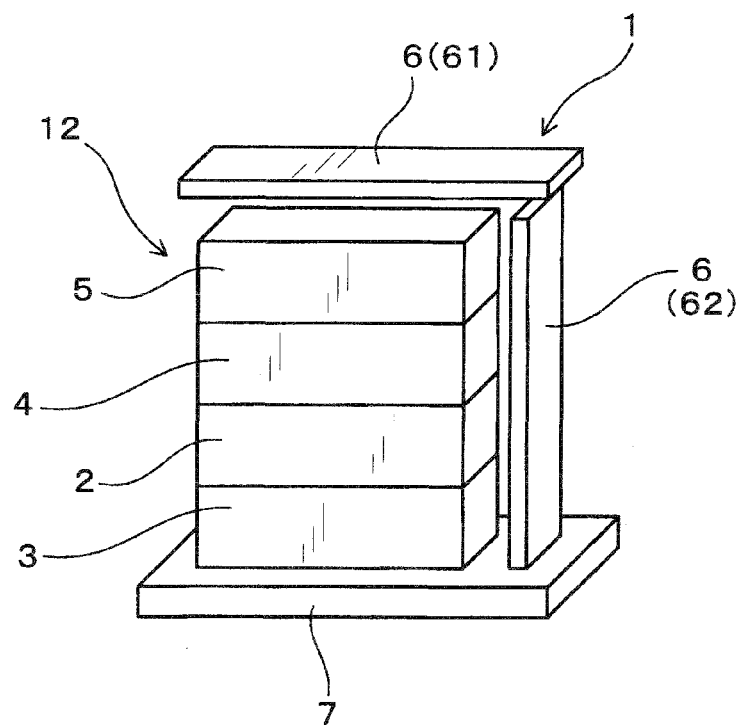
FIG. 7 is a perspective view showing an overall structure of an electric power source device according to a fourth exemplary embodiment of the present invention.

FIG. 7 is a perspective view showing an overall structure of the electric power source device 1 according to the fourth exemplary embodiment. As shown in FIG. 7, in the structure of the electric power source device 1, the primary side semiconductor component 3, the transformer 2, the secondary side semiconductor component 4 and the choke coil 5 are stacked in order to form a stacked section 12 in the direction of a normal line of the base plate 7. Further, the stacked section 12 faces the side surface of the second circuit substrate 62. The second circuit substrate 62 is arranged to stand on the base plate 7, i.e. in the stacked direction of the stacked section 12 and the direction of a normal line of the base plate 7. In other words, the stacking direction of the stacked section 12 is similar to the longitudinal direction, i.e. the major direction of the second circuit substrate 62.

Other components in the electric power source device 1 according to the fourth exemplary embodiment are similar to those of the electric power source device 1 according to the first exemplary embodiment. The same components between the fourth exemplary embodiment and the first exemplary embodiment will be referred to with the same reference numbers.

The fourth exemplary embodiment allows the electric power source device 1 to have a more reduced size in the longitudinal direction, i.e. the major direction of the base plate 7. In addition to this feature, it is possible to increase the overall area of the second circuit substrate 62 while suppressing the overall size of the electric power source device 1 from increasing.

Other components in the electric power source device 1 according to the fourth exemplary embodiment are similar to those of the electric power source device 1 according to the first exemplary embodiment. Further, the electric power source device according to the fourth exemplary embodiment has the same effects of the electric power source device according to the first exemplary embodiment as previously described.

It is also possible for the electric power source device according to the fourth exemplary embodiment to have a different arrangement of the components in the stacked section 12 such as the transformer 2, the primary side semiconductor component 3, the secondary side semiconductor component 4 and the choke coil 5.

Fifth Exemplary Embodiment

A description will be given of the electric power source device 1 according to the fifth exemplary embodiment with reference to FIG. 8, FIG. 9 and FIG. 10.

Figure 8:
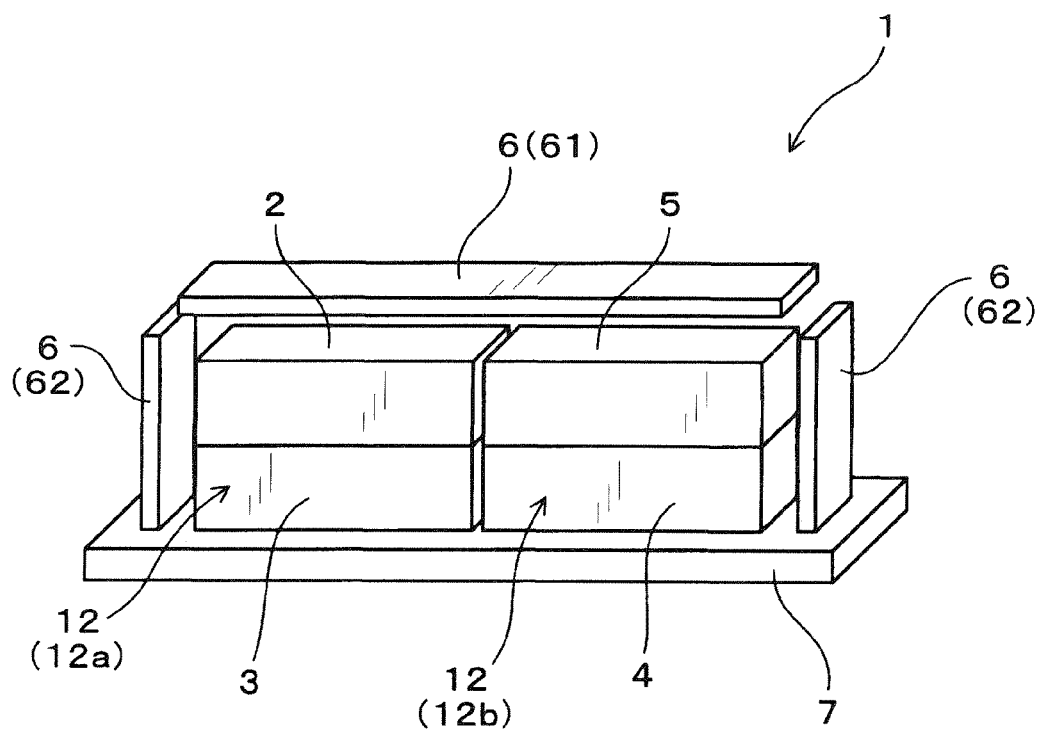
FIG. 8 is a perspective view showing an overall structure of an electric power source device according to a fifth exemplary embodiment of the present invention.

FIG. 8 is a perspective view showing an overall structure of the electric power source device 1 according to the fifth exemplary embodiment. The electric power source device 1 according to the fifth exemplary embodiment has a plurality of the second circuit substrates 62. As shown in FIG. 8, the two second circuit substrates 62 stand, i.e. are formed on the base plate 7. The second circuit substrates 62 are arranged at both sides of the base plate 7 in the direction of a normal line of the base plate 7. The two stacked sections 12 (12a, 12b) are sandwiched between the two second circuit substrates 12 (12a, 12b). The first stacked section 12a faces the side surface of one of the second circuit substrates 62. The second stacked section 12b faces the side surface of the other second circuit substrate 62.

The first stacked section 12a and the second stacked section 12b have the same structure and arrangement of those in the electric power soured device according to the third exemplary embodiment shown in FIG. 6. The first stacked section 12a and the second stacked section 12b are arranged between the first circuit substrate 61 and the base plate 7.

The two second circuit substrates 62 are arranged outside of both the sides of the first circuit substrate 61 in the longitudinal direction, i.e. the major direction of the first circuit substrate 61.

The first circuit substrate 61 is arranged outside of both the sides of each of the second circuit substrates 62 in the longitudinal direction, i.e. the major direction of the second circuit substrates 62. In other words, when observed from the direction of a normal line of the first circuit substrate 61, the second circuit substrates 62 are arranged outside of the first circuit substrate 61. Further, when observed from the direction of a normal line of the second circuit substrates 62, the first circuit substrate 61 is arranged outside of the second circuit substrates 62.

Other components in the electric power source device 1 according to the fifth exemplary embodiment are similar to those of the electric power source device 1 according to the third exemplary embodiment. The same components between the fifth exemplary embodiment and the first and three exemplary embodiments will be referred to with the same reference numbers.

Because of using a plurality of the second circuit substrates 62, the electric power source device 1 according to the fifth exemplary embodiment have a more increased circuit area and suppresses the overall size of the electric power source device 1.

The concept of the present invention is not limited by the structure of the first circuit substrate 61 and the second circuit substrates 62 shown in FIG. 8. For example, it is possible to have a structure shown in FIG. 9.

Figure 9:
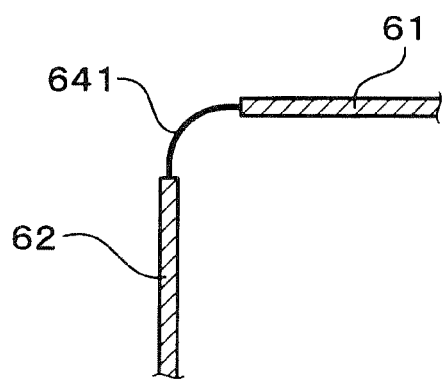
FIG. 9 is a view showing a cross section of a flat cable as a flexible member through which a first circuit substrate is connected to a second circuit substrate.

FIG. 9 is a view showing a cross section of a flat cable 641 through which the first circuit substrate 61 is connected to each of the second circuit substrates 62. As shown in FIG. 9, it is possible to electrically connect the first circuit substrate 61 to each of the second circuit substrates 62 through the flat cable 641 as a flexible member. When observed from the direction of a normal line of the first circuit substrate 61, the second circuit substrates 62 are arranged outside of the first circuit substrate 61. Further, when observed from the direction of a normal line of the second circuit substrates 62, the first circuit substrate 61 is arranged outside of the second circuit substrates 62. This arrangement of the first circuit substrate 61 and the second circuit substrates 62 makes it possible to reduce a deformation amount of the flat cable 641 and an overall length of the flat cable 641.

Figure 10:
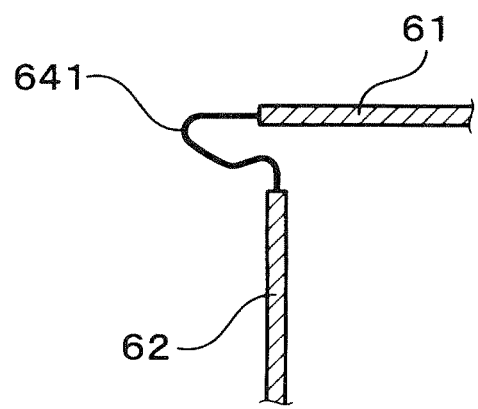
FIG. 10 is a view showing a cross section of the flat cable when the second circuit substrate is arranged inside of the first circuit substrate when viewed from the direction of a normal line of the first circuit substrate.

That is, if at least one of the second circuit substrates 62 is arranged inside of the first circuit substrate 61 when viewed from the direction of a normal line of the first circuit substrate 61, i.e. in the direction of a normal line of the base plate 7, it would be necessary to have a structure in which the flat cable 641 is significantly deformed, as shown in FIG. 10.

FIG. 10 is a view showing a cross section of the flat cable 641 when the second circuit substrate 62 is arranged inside of the first circuit substrate 61 when viewed from the direction of a normal line of the first circuit substrate 61. This further increases an overall length of the flat cable 641.

On the other hand, in the arrangement of the first circuit substrate 61 and the second circuit substrates 62 shown in FIG. 9, it is possible to shorten the overall length of the flat cable 641 when the second circuit substrate 62 is arranged outside of the first circuit substrate 61 when viewed from the direction of a normal line of the first circuit substrate 61. That is, the structure of the electric power source device 1 according to the fifth exemplary embodiment makes it possible to suppress a deformation amount of the flat cable 641 from being increased and possible to shorten the overall length of the flat cable 641.

Further, the electric power source device 1 according to the fifth exemplary embodiment has the same actions and effects of the electric power source device according to the third exemplary embodiment as previously described.

Figure 11:
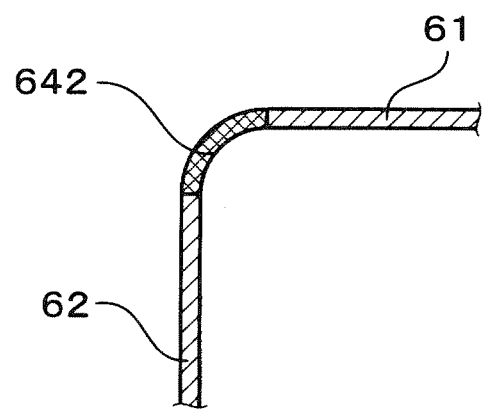
FIG. 11 is a view showing a cross section of a flexible substrate with which the first circuit substrate is connected to the second circuit substrate.

FIG. 11 is a view showing a cross section of a flexible substrate 642 or a flexible plate with which the first circuit substrate 61 is connected to each of the second circuit substrates 62. As shown in FIG. 11, it is possible to connect the first circuit substrate 61 to each of the second circuit substrates 62 by the flexible substrate 642. In this case, through the flexible substrate 642 having a curved shape, the first circuit substrate 61 is connected to the second circuit substrate 62 when the first circuit substrate 61 is arranged at a right angle with the second circuit substrate 62.

Sixth Exemplary Embodiment

A description will be given of the electric power source device 1 according to the sixth exemplary embodiment with reference to FIG. 12.

Figure 12:
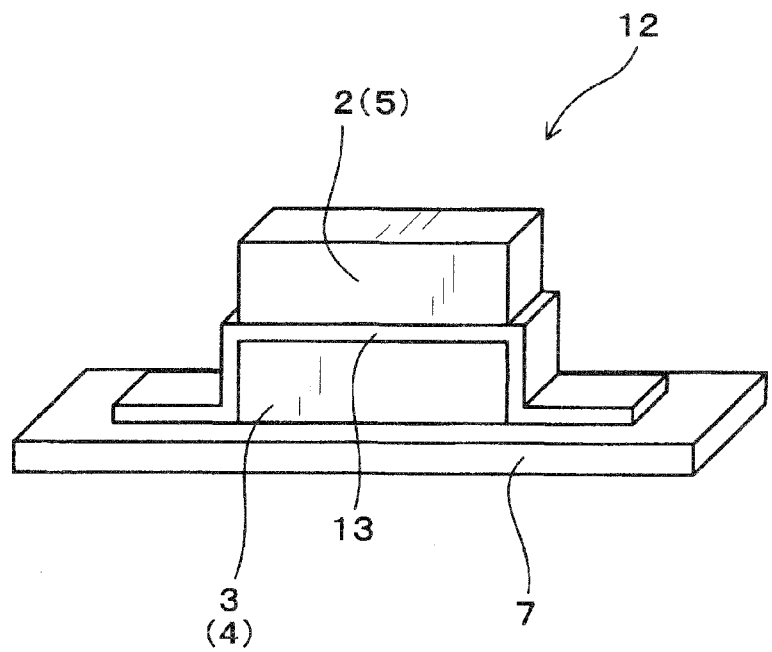
FIG. 12 is a perspective view showing a partial structure of an electric power source device according to a sixth exemplary embodiment of the present invention.

FIG. 12 is a perspective view showing a partial structure of the electric power source device 1 according to the sixth exemplary embodiment. As shown in FIG. 12, a radiation member 13 is arranged between at least a pair of components which forms the stacked section 12. For example, it is possible to have a structure in which the radiation member 13 is arranged between the primary side semiconductor component 3 and the transformer 2 which form the stacked section 12. It is further possible to have a structure in which the radiation member 13 is arranged between the secondary side semiconductor component 4 and the choke coil 5 which form the other stacked section 12.

Figure 14:
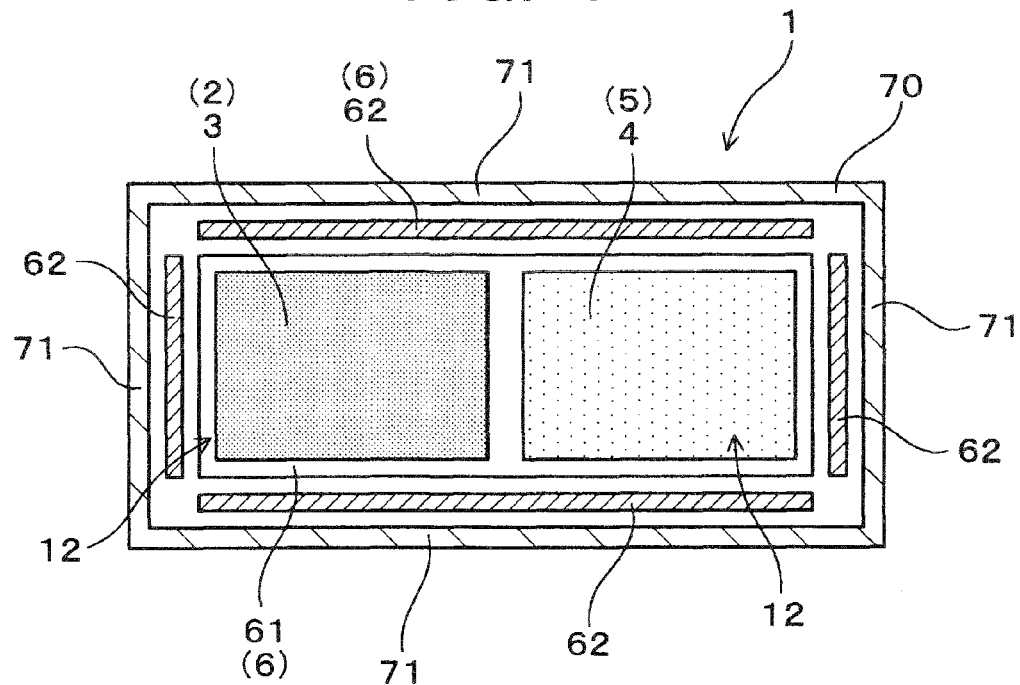
FIG. 14 is a view showing a cross section, parallel to a base plate, of an electric power source device according to an eighth exemplary embodiment of the present invention.
Figure 15:
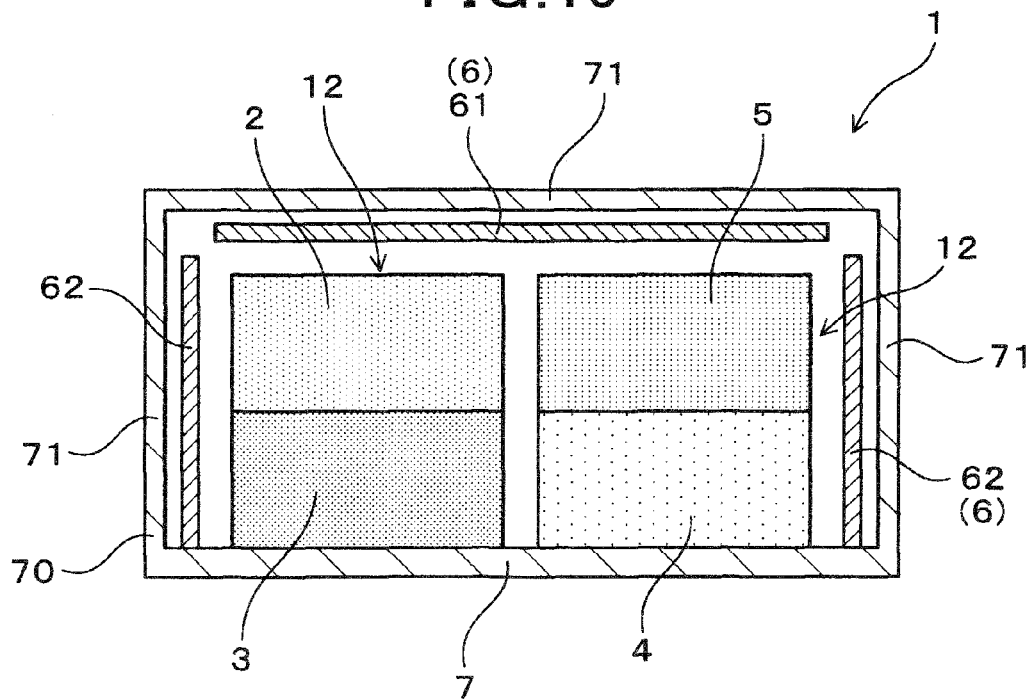
FIG. 15 is a view showing a cross section, parallel to a normal line of the base plate, of the electric power source device according to the eighth exemplary embodiment of the present invention.

Still further, it is possible to have a structure in which a part of the radiation member 13 is in contact with the base plate 7, or with a part of a housing, which is different from the base plate 7, (for example, as designated with reference number 70 shown in FIG. 14 and FIG. 15). It is possible that the radiation member 13 is made of a superior heat conductive member, for example, metal such as a copper.

Other components in the electric power source device 1 according to the sixth exemplary embodiment are similar to those of the electric power source device 1 according to the third exemplary embodiment. The same components between the sixth exemplary embodiment and the first and three exemplary embodiments will be referred to with the same reference numbers.

The structure of the electric power source device 1 according to the sixth exemplary embodiment makes it possible to discharge or radiate heat energy generated in the stacked section 12. Accordingly, the sixth exemplary embodiment provides the electric power source device 1 having a superior radiating function. Having the superior radiating function allows the reduction of the overall size of the electric power source device 1 viewing in a heat radiation design.

Further, the electric power source device 1 according to the sixth exemplary embodiment has the same actions and effects of the electric power source device according to the first exemplary embodiment as previously described.

The concept disclosed by the sixth exemplary embodiment previously described can be applied to the electric power source device 1 according to the fourth exemplary embodiment having the stacked later 12 composed of at least three components. That is, it is possible to arrange the radiation member 13 between the surfaces of not less than two components in the stacked section 12.

Seventh Exemplary Embodiment

A description will be given of the electric power source device 1 according to the seventh exemplary embodiment with reference to FIG. 13.

Figure 13:
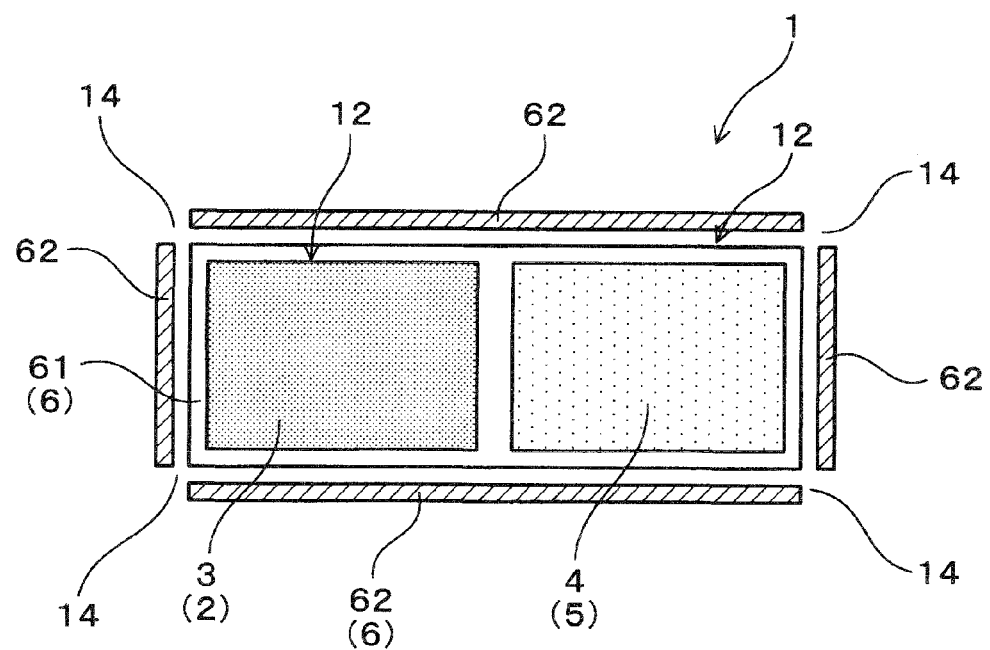
FIG. 13 is a view showing a cross section, parallel to a base plate, of an electric power source device according to a seventh exemplary embodiment of the present invention.

FIG. 13 is a view showing a cross section, parallel to the base plate 7, of the electric power source device 1 according to the seventh exemplary embodiment. The electric power source device 1 according to the seventh exemplary embodiment has four second circuit substrates 62 shown in FIG. 13. That is, the four second circuit substrates 62 are arranged between the first circuit substrate 61 and the base plate 7

(which are omitted from FIG. 13) so that the four second circuit substrates 62 form four side walls of a square box and are arranged in a direction which is perpendicular to the direction of a normal line of the base plate 7 as shown in FIG. 13.

The top and the bottom of the two stacked sections 12 are covered with the first circuit substrate 61 and the base plate 7, like the structure disclosed by the third exemplary embodiment shown in FIG. 6. The four second circuit substrates 62 are arranged outside of the first circuit substrate 61 when observed from the direction of a normal line of the first circuit substrate 61.

As shown in FIG. 13, the two stacked sections 12 are surrounded in a three dimensional (3D) space by the arrangement of the first circuit substrate 61 (omitted from FIG. 13), the four second circuit substrates 62 and the base plate 7 (omitted from FIG. 13). A slit section 14 is formed between the two second circuit substrates 62 which are adjacent to each other.

Other components in the electric power source device 1 according to the seventh exemplary embodiment are similar to those of the electric power source device 1 according to the fifth exemplary embodiment. The same components between the seventh exemplary embodiment and the first and fifth exemplary embodiments will be referred to with the same reference numbers.

Because of arranging the four second circuit substrates 62, the seventh exemplary embodiment suppresses the overall size of the electric power source device 1 and increases its overall circuit area.

In addition, as previously described, because the stacked sections 12 are surrounded in a three dimensional space by the base plate 7, the first circuit substrate 61 and the four second circuit substrates 62, the four slit section 14 are formed between the second circuit substrates 62 which are adjacent to each other. The presence of the slits 14 promotes radiation of heat energy generated in the stacked sections 12 to the outside of the electric power source device 1.

Further, the electric power source device 1 according to the seventh exemplary embodiment has the same actions and effects of the electric power source device according to the fifth exemplary embodiment as previously described.

Eighth Exemplary Embodiment

A description will be given of the electric power source device 1 according to the eighth exemplary embodiment with reference to FIG. 14 and FIG. 15.

FIG. 14 is a view showing a cross section parallel to a base plate 7 (omitted from FIG. 14) of the electric power source device 1 according to the eighth exemplary embodiment. FIG. 15 is a view showing a cross section, parallel to a normal line of the base plate 7, of the electric power source device 1 according to the eighth exemplary embodiment.

As shown in FIG. 14 and FIG. 15, the electric power source device 1 according to the eighth exemplary embodiment has a housing 70 which accommodates the components. In the structure of the electric power source device 1 according to the eighth exemplary embodiment, in particular, at least one of the first circuit substrate 61 and the second circuit substrates 62 is arranged opposite to a wall section 71 of the housing 70.

The housing 70 has a rectangular solid shape, or a box-like shape in which the base plate 7 forms one surface of the housing 70. The base plate 7 is one of the surfaces of the housing 70 having a rectangular solid shape. The housing 70 is composed of the base plate 7 and the five wall sections 71 shown in FIG. 14, where one of the five wall sections 71 is omitted from FIG. 14.

As shown in FIG. 15, the first circuit substrates 61 is arranged to face the wall sections 71 which are arranged opposite to the base plate 7. As shown in FIG. 14, the four second circuit substrates 62 are arranged to face the four wall sections 71, respectively, so that the direction of a normal line of the base plate 7 is perpendicular to the direction of a normal line of each of the four wall sections 71.

Other components in the electric power source device 1 according to the eighth exemplary embodiment are similar to those of the electric power source device 1 according to the seventh exemplary embodiment. The same components between the eighth exemplary embodiment and the fifth exemplary embodiment will be referred to with the same reference numbers.

In the structure of the electric power source device 1 according to the eighth exemplary embodiment, the first circuit substrate 61 and the second circuit substrates 62 are arranged along and parallel to the wall sections 71 of the housing 70. This allows the effective use of the inside space of the housing 70 and makes it possible to reduce the dead space in the housing 70.

Still further, when the ground conductive layer 630 (see FIG. 4) is added to each of the circuit substrate 6 (which is comprised of the first circuit substrate 61 and the second circuit substrates 62), it is possible to shield electromagnetic noise generated in the inside of the electric power source device 1 by the double structure composed of the circuit substrate 6 (which includes the ground conductive layer 630) and the housing 70. This makes it possible to further suppress leakage of electromagnetic noise from the electric power source device 1. Other components in the electric power source device 1 according to the eighth exemplary embodiment are similar to those of the electric power source device 1 according to the seventh exemplary embodiment. Further, the electric power source device according to the eighth exemplary embodiment has the same effects of the electric power source device according to the first exemplary embodiment as previously described.

It is possible to combine the structure of the electric power source device according to the first to eighth exemplary embodiments previously described. The concept of the present invention is not limited by the structure of circuits formed on each of the first circuit substrate 61 and the second circuit substrates 62 previously described. It is sufficient to form at least one component or a group of components selected from some circuit components in the primary side circuit, some circuit components in the secondary side circuit, and the control circuit on each of the first circuit substrate and the second circuit substrates.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. An electric power source device comprising:
a transformer comprising a primary coil and a secondary coil;
primary side semiconductor components forming a primary side circuit connected to the primary coil of the transformer;

secondary side semiconductor components forming a secondary side circuit connected to the secondary coil of the transformer;

a choke coil forming a smoothing circuit capable of smoothing an output voltage;

a plurality of circuit substrates on which a control circuit is formed, the control circuit controlling some components in the primary side circuit and some components in the secondary side circuit, or at least one selected from the primary side circuit and the secondary side circuit; and a base plate on which the transformer, the primary side semiconductor components, the secondary side semiconductor components and the choke coil are formed, wherein the plurality of the circuit substrates comprises a first circuit substrate and one or more second circuit substrates, the first circuit substrate is arranged to be parallel to the base plate, and the second circuit substrate is arranged to be parallel to a normal line of the first circuit substrate.

2. The electric power source device according to claim 1, wherein the circuit substrates are arranged to face at least one selected from the transformer, the primary side semiconductor components, the secondary side semiconductor components and the choke coil.

3. The electric power source device according to claim 2, wherein at least one of the circuit substrates comprises a ground conductive layer formed in a longitudinal direction of its circuit substrate.

4. The electric power source device according to claim 2, wherein a conductive plate is arranged between at least one component selected from the transformer and the choke coil and at least one of the circuit substrates.

5. The electric power source device according to claim 3, wherein a conductive plate is arranged between at least one component selected from the transformer and the choke coil and at least one of the circuit substrates.

6. The electric power source device according to claim 1, wherein at least two components selected from the transformer, the primary side semiconductor components, the secondary side semiconductor components and the choke coil are stacked together in a direction of a normal line of the base plate to form one or more of the stacked sections.

7. The electric power source device according to claim 2, wherein at least two components selected from the transformer, the primary side semiconductor components, the secondary side semiconductor components and the choke coil are stacked together in a direction of a normal line of the base plate to form one or more of the stacked sections.

8. The electric power source device according to claim 6, wherein each of the first circuit substrate and the second circuit substrates is arranged to face the stacked sections.

9. The electric power source device according to claim 7, wherein each of the first circuit substrate and the second circuit substrates is arranged to face the stacked sections.

10. The electric power source device according to claim 8, wherein the second circuit substrates are arranged opposing to face each other through the stacked sections.

11. The electric power source device according to claim 9, wherein the second circuit substrates are arranged opposing to face each other through the stacked sections.

12. The electric power source device according to claim 10, wherein a slit section is formed between the second circuit substrates which are adjacent to each other.

13. The electric power source device according to claim 11, wherein a slit section is formed between the second circuit substrates which are adjacent to each other.

14. The electric power source device according to claim 6, wherein a radiation member is arranged between two components in the stacked section.

15. The electric power source device according to claim 7, wherein a radiation member is arranged between two components in the stacked section.

16. The electric power source device according to claim 1, wherein the second circuit substrate is arranged outside of the first circuit substrate viewing in a direction of a normal line of the first circuit substrate, and the first circuit substrate is arranged outside of the second circuit substrate viewing in a direction of a normal line of the second circuit substrate.

17. The electric power source device according to claim 2, wherein the second circuit substrate is arranged outside of the first circuit substrate viewing in a direction of a normal line of the first circuit substrate, and the first circuit substrate is arranged outside of the second circuit substrate viewing in a direction of a normal line of the second circuit substrate.

18. The electric power source device according to claim 1, comprising a housing which accommodates the components comprising the transformer, the primary side semiconductor components, the secondary side semiconductor components, the choke coil, the first circuit substrate and the second circuit substrates, wherein at least one of the first circuit substrate and the second circuit substrate is arranged to face a wall section of the housing.

19. The electric power source device according to claim 2, comprising a housing which accommodates the components comprising the transformer, the primary side semiconductor components, the secondary side semiconductor components, the choke coil, the first circuit substrate and the second circuit substrates, wherein at least one of the first circuit substrate and the second circuit substrate is arranged to face a wall section of the housing.

* * * * *